United States Patent
Broughton et al.

(10) Patent No.: US 9,699,833 B2
(45) Date of Patent: Jul. 4, 2017

(54) ELECTRONIC UNIT MOUNTING

(71) Applicant: ROLLS-ROYCE PLC, London (GB)

(72) Inventors: Paul Broughton, Leicester (GB); Richard Peace, Derby (GB); Gary Alan Skinner, Nottingham (GB); Robin Charles Kennea, Nottingham (GB)

(73) Assignee: ROLLS-ROYCE plc, London (GB)

( * ) Notice: Subject to any disclaimer, the term of this patent is extended or adjusted under 35 U.S.C. 154(b) by 748 days.

(21) Appl. No.: 13/716,439

(22) Filed: Dec. 17, 2012

(65) Prior Publication Data

US 2013/0160461 A1    Jun. 27, 2013

(30) Foreign Application Priority Data

Dec. 22, 2011 (GB) .................................. 1122140.5
Dec. 22, 2011 (GB) .................................. 1122143.9
(Continued)

(51) Int. Cl.
*F02C 7/32* (2006.01)
*H05B 3/28* (2006.01)
(Continued)

(52) U.S. Cl.
CPC .............. *H05B 3/28* (2013.01); *B23P 6/005* (2013.01); *B60R 16/00* (2013.01); *B60R 16/02* (2013.01);
(Continued)

(58) Field of Classification Search
CPC ............ B60R 16/0207; B60R 16/0215; H01B 7/0045; H01B 7/0072; F02C 7/20; F02C 7/12; F02C 7/32
(Continued)

(56) References Cited

U.S. PATENT DOCUMENTS 2,523,083 A    9/1950    Witkowski
2,523,504 A    9/1950    Ford, Jr.
(Continued)

FOREIGN PATENT DOCUMENTS

DE    2941950 B1    2/1981
EP    1741879 A1    1/2007
(Continued)

OTHER PUBLICATIONS

Jun. 5, 2015 Office Action issued in U.S. Appl. No. 13/716,708.
Jun. 12, 2015 Office Action issued in U.S. Appl. No. 13/716,254.
Nellis and Klein, "Heat Transfer", 2009, Campridge University, pp. 748-751.
(Continued)

*Primary Examiner* — Ehud Gartenberg
*Assistant Examiner* — Thomas Burke
(74) *Attorney, Agent, or Firm* — Oliff PLC

(57) ABSTRACT

An electrical assembly 600 comprising an electrical raft 200 and an electronic unit 300 is provided to a gas turbine engine 10. The electrical raft 200 has electrical conductors 252 embedded in a rigid material 220, which may be a rigid composite material. The electrical conductors 252 are in electrical contact with the electronic unit 300. When the electronic unit 300 is installed, at least a part 310 of it forms a part of a gas-washed surface of the engine 10. The electronic unit 300 is then easily accessible from the engine 10, and potentially complex and/or heavy access doors/panels may not be required.

16 Claims, 9 Drawing Sheets

(30) Foreign Application Priority Data

Mar. 7, 2012 (GB) .................................. 1203991.3
May 3, 2012 (GB) .................................. 1207733.5

(51) Int. Cl.

| | | |
|---|---|---|
| F02C 7/12 | (2006.01) | |
| F02C 7/20 | (2006.01) | |
| B23P 6/00 | (2006.01) | |
| H02G 3/04 | (2006.01) | |
| H01R 12/00 | (2006.01) | |
| H02G 3/32 | (2006.01) | |
| B60R 16/02 | (2006.01) | |
| B64C 3/34 | (2006.01) | |
| F02C 7/141 | (2006.01) | |
| B60R 16/08 | (2006.01) | |
| F02C 7/16 | (2006.01) | |
| H01R 12/57 | (2011.01) | |
| H01R 12/59 | (2011.01) | |
| H01R 12/51 | (2011.01) | |
| H01R 12/61 | (2011.01) | |
| H02G 3/00 | (2006.01) | |
| B60R 16/00 | (2006.01) | |
| B64D 29/08 | (2006.01) | |
| F02C 7/00 | (2006.01) | |
| H02G 1/00 | (2006.01) | |
| H02G 3/02 | (2006.01) | |
| F02C 7/047 | (2006.01) | |
| F02C 7/224 | (2006.01) | |
| F24H 1/10 | (2006.01) | |
| H05B 1/02 | (2006.01) | |
| H05K 7/20 | (2006.01) | |

(52) U.S. Cl.
CPC ...... *B60R 16/0207* (2013.01); *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01); *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *H05K 7/20* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(58) Field of Classification Search
USPC .......................................................... 60/796
See application file for complete search history.

(56) References Cited

U.S. PATENT DOCUMENTS

| | | | |
|---|---|---|---|
| 2,877,544 A | 3/1959 | Gammel | |
| 3,128,214 A * | 4/1964 | Lay | H01B 7/0045 156/56 |
| 3,284,003 A | 11/1966 | Ciemochowski | |
| 3,494,657 A | 2/1970 | Harper et al. | |
| 3,612,744 A | 10/1971 | Thomas | |
| 3,700,825 A | 10/1972 | Taplin et al. | |
| 3,710,568 A | 1/1973 | Rice | |
| 3,730,458 A * | 5/1973 | Haberkorn | B64C 5/12 244/218 |
| 4,108,328 A * | 8/1978 | Page | B64D 37/06 220/319 |
| 4,137,888 A | 2/1979 | Allan | |
| 4,149,567 A | 4/1979 | Weirich | |
| 4,220,912 A | 9/1980 | Williams | |
| 4,488,970 A | 12/1984 | Clark | |
| 4,671,593 A | 6/1987 | Millon-Fremillon et al. | |
| 4,784,575 A * | 11/1988 | Nelson | B64C 11/18 416/144 |
| 5,004,639 A | 4/1991 | Desai | |
| 5,031,396 A | 7/1991 | Margnelli | |
| 5,091,605 A | 2/1992 | Clifford | |
| 5,120,005 A * | 6/1992 | Reedy | B64C 9/32 239/265.39 |
| 5,138,784 A | 8/1992 | Niwa | |
| 5,142,448 A | 8/1992 | Kober et al. | |
| 5,174,110 A * | 12/1992 | Duesler | F02C 7/32 138/111 |
| 5,249,417 A | 10/1993 | Duesler et al. | |
| 5,435,124 A | 7/1995 | Sadil et al. | |
| 5,688,145 A | 11/1997 | Liu | |
| 5,692,909 A | 12/1997 | Gadzinski | |
| 5,795,172 A | 8/1998 | Shahriari et al. | |
| 5,870,824 A | 2/1999 | Lilja et al. | |
| 5,876,013 A | 3/1999 | Ott | |
| 5,885,111 A | 3/1999 | Yu | |
| 5,895,889 A | 4/1999 | Uchida et al. | |
| 6,050,853 A | 4/2000 | Ando et al. | |
| 6,089,935 A * | 7/2000 | Fleming, III | B63B 35/81 441/79 |
| 6,157,542 A | 12/2000 | Wu | |
| 6,298,945 B1 * | 10/2001 | Anders | A62C 99/00 169/70 |
| 6,399,889 B1 | 6/2002 | Korkowski et al. | |
| 6,434,473 B1 | 8/2002 | Hattori | |
| 6,481,101 B2 | 11/2002 | Reichinger | |
| 6,588,820 B2 | 7/2003 | Rice | |
| 6,689,446 B2 | 2/2004 | Barnes et al. | |
| 6,702,607 B2 * | 3/2004 | Kondo | H05K 1/118 174/72 A |
| 6,969,807 B1 | 11/2005 | Lin et al. | |
| 6,971,650 B2 | 12/2005 | Marelja | |
| 6,971,841 B2 | 12/2005 | Care | |
| 7,002,269 B2 | 2/2006 | Angerpointer | |
| 7,010,906 B2 | 3/2006 | Cazenave et al. | |
| 7,232,315 B2 | 6/2007 | Uchida et al. | |
| 7,281,318 B2 | 10/2007 | Marshall et al. | |
| 7,389,977 B1 | 6/2008 | Fernandez et al. | |
| 7,414,189 B2 | 8/2008 | Griess | |
| 7,500,644 B2 | 3/2009 | Naudet et al. | |
| 7,506,499 B2 | 3/2009 | Fert et al. | |
| 7,516,621 B2 | 4/2009 | Suttie et al. | |
| 7,525,816 B2 | 4/2009 | Sawachi | |
| 7,543,442 B2 | 6/2009 | Derenes et al. | |
| 7,661,272 B2 | 2/2010 | Gagneux et al. | |
| 7,745,730 B2 | 6/2010 | Bailey | |
| 7,762,502 B2 | 7/2010 | Mesing et al. | |
| 7,837,497 B1 | 11/2010 | Matsuo et al. | |
| 7,862,348 B2 | 1/2011 | Strauss | |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 | 7/2013 | Peer et al. | |
| 8,522,522 B2 * | 9/2013 | Poisson | F01D 15/10 60/39.093 |
| 8,581,103 B2 | 11/2013 | Aspas Puertolas | |
| 8,794,584 B2 | 8/2014 | Shimada et al. | |
| 8,937,254 B2 | 1/2015 | Wen et al. | |
| 9,010,716 B2 | 4/2015 | Kobori | |
| 9,040,821 B2 | 5/2015 | Blanchard et al. | |
| 2002/0086586 A1 | 7/2002 | Shi et al. | |
| 2002/0170729 A1 | 11/2002 | Murakami et al. | |
| 2003/0095389 A1 | 5/2003 | Samant et al. | |
| 2003/0155467 A1 | 8/2003 | Petrenko | |

(56) References Cited

U.S. PATENT DOCUMENTS

| | | | |
|---|---|---|---|
| 2004/0065092 A1 | 4/2004 | Wadia et al. | |
| 2004/0238687 A1* | 12/2004 | Jones | B64D 29/08 244/62 |
| 2004/0266266 A1 | 12/2004 | Lai | |
| 2004/0266274 A1 | 12/2004 | Naudet et al. | |
| 2005/0045774 A1* | 3/2005 | Hocking | B64C 21/06 244/209 |
| 2006/0272340 A1 | 12/2006 | Petrenko | |
| 2006/0278423 A1 | 12/2006 | Ichikawa et al. | |
| 2007/0029454 A1 | 2/2007 | Suttie et al. | |
| 2007/0084216 A1 | 4/2007 | Mazeaud et al. | |
| 2007/0129902 A1 | 6/2007 | Orbell | |
| 2008/0128048 A1 | 6/2008 | Johnson et al. | |
| 2008/0179448 A1 | 7/2008 | Layland et al. | |
| 2008/0185478 A1 | 8/2008 | Dannenberg | |
| 2008/0245932 A1 | 10/2008 | Prellwitz et al. | |
| 2009/0175718 A1* | 7/2009 | Diaz | F01D 25/12 415/180 |
| 2009/0189051 A1 | 7/2009 | Love | |
| 2009/0230650 A1 | 9/2009 | Mayen et al. | |
| 2009/0242703 A1 | 10/2009 | Alexander et al. | |
| 2009/0277578 A1 | 11/2009 | Sung et al. | |
| 2009/0289232 A1 | 11/2009 | Rice | |
| 2010/0162726 A1 | 7/2010 | Robertson et al. | |
| 2010/0199629 A1 | 8/2010 | Chene et al. | |
| 2010/0261365 A1 | 10/2010 | Sakakura | |
| 2010/0308169 A1 | 12/2010 | Blanchard et al. | |
| 2011/0011627 A1 | 1/2011 | Aspas Puertolas | |
| 2011/0016882 A1 | 1/2011 | Woelke et al. | |
| 2011/0017879 A1 | 1/2011 | Woelke et al. | |
| 2011/0053468 A1 | 3/2011 | Vontell | |
| 2011/0111616 A1 | 5/2011 | Chang et al. | |
| 2011/0120748 A1 | 5/2011 | Bailey | |
| 2011/0271655 A1 | 11/2011 | Poisson | |
| 2011/0315830 A1 | 12/2011 | Eshima et al. | |
| 2012/0012710 A1 | 1/2012 | Yamaguchi et al. | |
| 2012/0103685 A1 | 5/2012 | Blanchard et al. | |
| 2012/0111614 A1 | 5/2012 | Free | |
| 2012/0149232 A1 | 6/2012 | Balzano | |
| 2012/0312022 A1 | 12/2012 | Lam et al. | |
| 2013/0189868 A1 | 7/2013 | Fitt et al. | |
| 2013/0316147 A1 | 11/2013 | Douglas et al. | |

FOREIGN PATENT DOCUMENTS

| | | |
|---|---|---|
| EP | 1 760 291 A2 | 3/2007 |
| EP | 1 762 714 A2 | 3/2007 |
| EP | 2279852 A1 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2460693 A | 12/2009 |
| GB | 2463867 A | 3/2010 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 2006/136748 A2 | 12/2006 |
| WO | 2009/118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Jun. 19, 2015 Office Action issued in U.S. Appl. No. 13/716,244.
Jul. 17, 2015 Office Action issued in U.S. Appl. No. 13/716,497.
Jul. 29, 2015 Office Action issued in U.S. Appl. No. 13/716,648.
Apr. 20, 2012 Search Report issued in British Patent Application No. GB1122140.5.
Apr. 19, 2012 Search Report issued in British Patent Application No. GB1122143.9.
Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,497, filed Dec. 17, 2012.
Broughton et al., Pending U.S. Appl. No. 13/716,254, filed Dec. 17, 2012.
Willmot et al., Pending U.S. Appl. No. 13/716,300, filed Dec. 17, 2012.
Willmot et al., Pending U.S. Appl. No. 13/716,239, filed Dec. 17, 2012.
Broughton et al., Pending U.S. Appl. No. 13/716,587, filed Dec. 17, 2012.
Maszczk et al., Pending U.S. Appl. No. 13/716,796, filed Dec. 17, 2012.
Willmot et al., Pending U.S. Appl. No. 13/716,808, filed Dec. 17, 2012.
Broughton et al., Pending U.S. Appl. No. 13/716,708, filed Dec. 17, 2012.
Dalton et al., Pending U.S. Appl. No. 13/716,244, filed Dec. 17, 2012.
Broughton et al., Pending U.S. Appl. No. 13/716,503, filed Dec. 17, 2012.
Broughton et al., Pending U.S. Appl. No. 13/716,516, filed Dec. 17, 2012.
Fitt et al., Pending U.S. Appl. No. 13/792,851, filed Mar. 11, 2013.
Apr. 23, 2014 European Search Report issued in European Patent Application No. 12 19 7402.
Apr. 24, 2014 European Search Report issued in European Patent Application No. 13 19 5848.
Aug. 5, 2013. Search Report issued in British Patent Application No. 1308033.8.
Oct. 25, 2013 European Search Report issued in European Patent Application No. 13 15 8531.
Broughton et al., U.S. Appl. No. 14/100,745, filed Dec. 9, 2013.
Feb. 25, 2015 Office Action issued in U.S. Appl. No. 13/716,497.
Mar. 11, 2015 Office Action issued in U.S. Appl. No. 13/716,300.
Apr. 6, 2015 Office Action issued in U.S. Appl. No. 13/716,648.
Aug. 13, 2015 Office Action issued in U.S. Appl. No. 13/716,516.
Aug. 14, 2015 Office Action issued in U.S. Appl. No. 13/716,239.
Aug. 27, 2015 Office Action issued in U.S. Appl. No. 13/792,851.
Sep. 4, 2015 Office Action issued in U.S. Appl. No. 13/716,503.
Jul. 28, 2015 Office Action issued in U.S. App. No. 13/716,796.
Aug. 15, 2014 Office Action issued in U.S. Appl. No. 13/716,497.
Nov. 10, 2014 Office Action issued in U.S. Appl. No. 13/716,300.
Nov. 20, 2014 Office Action issued in U.S. Appl. No. 13/716,648.
Apr. 13, 2017 Search Report issued in European Patent Application No. 12197393.

* cited by examiner

ELECTRONIC UNIT MOUNTING

CROSS-REFERENCE TO RELATED APPLICATIONS

This application is based upon and claims the benefit of priority from British Patent Application Number 1122140.5 filed 22 Dec. 2011, British Patent Application Number 1122143.9 filed 22 Dec. 2011, British Patent Application Number 1203991.3 filed 7 Mar. 2012 and British Patent Application Number 1207733.5 filed 3 May 2012, the entire contents of which are incorporated by reference.

BACKGROUND OF THE INVENTION

1. Field of the Invention

This invention relates to an electronic unit mounted to an engine. In particular, the invention relates to mounting an electronic unit to a gas turbine engine in such a way that that it forms part of the surface of the engine.

2. Description of the Related Art

A typical gas turbine engine may be provided with one or more electronic units, which may be referred to as electronic control units (ECUs), which may have the function of controlling and/or facilitating processes performed by the gas turbine engine and/or components of the gas turbine engine. Such ECUs may include one or more engine electronic controllers (EECs) and/or one or more engine health monitoring units (EMUs).

Typically, connecting an ECU to a gas turbine engine involves mechanically fixing the unit to the rest of the engine, and connecting a number of different electrical wires and/or harnesses in order to connect the ECU to one or more electrical systems of the engine. This is typically a time consuming and relatively complex process.

In other words, in a conventional arrangement, an ECU is electrically connected to wires in an electrical harness, which generally comprises multiple electrical wires and/or cables that may be generally flexible so as to be manipulated around the engine, and that may be surrounded by an insulating sleeve, which may be braided or have a braided cover.

Such an electrical harness is for transferring electrical power, and signals (which may be generated/received by an ECU) to and from electrical components/systems of the gas turbine engine. Such components/systems may serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals. Thus, such conventional harnesses may be used to transmit signals, for example control signals, between the ECU(s) and the electrical components/systems of the gas turbine engine.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components. The FIG. 1 example has an ECU 120. The ECU 120 is connected to the harnesses 102, 104 using connectors 122, 124 respectively. The ECU 120 would typically also be connected to other wires/harnesses, which are not labelled in FIG. 1 to aid clarity.

Thus the conventional electrical harness 102, 104 has to be provided with plug or socket connector components 112, 122, 124 for connection to other electrical components, such as ECUs. These conventional plug or socket connector components add weight and complexity to the electrical harnesses. Furthermore, the conventional plug or socket connectors are exposed to the engine environment. Thus, the conventional plug or socket connectors may be exposed to, for example, high temperatures and/or vibrations. The exposed connectors therefore need to be particularly robust in order to survive this environment. This means that the conventional exposed connectors are bulky and heavy. Even such bulky and heavy connectors may still be susceptible to damage and/or becoming loose, for example due to engine vibration.

Each of the conventional harnesses 102, 104 comprises a multitude of insulated wires and cables. This makes the conventional harness 102, 104 itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance and/or disconnection of the conventional harnesses from other components, such as the ECU) may also be complicated and/or time consuming. Thus, in many maintenance (or repair or overhaul) procedures on a gas turbine engine, removal and subsequent refitting of the conventional electrical harness and/or connected ECU(s) may account for a very significant proportion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electronic units, such as the ECUs, may be susceptible to damage and/or may add significant weight to the engine.

The wires and/or harnesses to which the ECUs are connected are usually enclosed within the engine, and thus once the ECU has been connected to the wires/harnesses, the ECU is usually covered by other components of the engine, and concealed by a gas-washed surface. Thus, once assembled, ECUs in a conventional arrangement are hidden and inaccessible from the outside of the assembled engine.

For example, an EEC of a conventional turbofan engine may be mounted on a fan case, for example using individual mounting brackets. Such an arrangement is shown in FIG. 2, in which an ECU 120 is mounted in a conventional way to a fan case 130 of a turbofan engine 100. The conventional complex arrangement of harnesses/cables is not shown in FIG. 2 to aid clarity. However, during assembly, the ECU 120 is manually connected to various flexible electrical wires and/or harnesses, and mechanically mounted to the fan case 130, in a time-consuming and relatively complex procedure. The electrical system, including the ECU and any wires/harnesses/connectors, must then covered by a gas-washed surface. In the case of an EEC (or other electronic unit) mounted on a fan case, such as that shown in FIG. 2, the enclosing gas-washed surface is commonly a nacelle (also not shown in FIG. 2 to aid clarity). Thus, in order to access the EEC, for example for maintenance/repair/replacement, the nacelle must be opened. Often, hinged panels, commonly referred to as fan cowl doors, are provided on the nacelle to allow access to the EEC. Opening the panels is a time consuming process, especially for larger engines in which a machine is required to lift and/or support the large, heavy panels. Furthermore, even when the doors are opened, the access to the ECU and related parts is usually limited and thus performing any maintenance/repair tasks can be difficult and/or time consuming. The cramped working environment, as well as the possibility of the moveable (hinged) panels becoming dislodged, means that there is a significant risk of injury to maintenance personnel.

Still further, the hinged panels must be designed to be operable in high winds, including significant wind gusts. This requirement drives significant weight into the structure, which in turn has an impact on overall fuel consumption of an aircraft to which the engine may be attached.

OBJECTS AND SUMMARY OF THE INVENTION

According to an aspect, there is provided a gas turbine engine having an electrical assembly that comprises an electrical raft having a rigid material with at least one electrical conductor embedded therein. The electrical assembly also comprises an electronic unit (or electronic control unit) mounted on the electrical raft and in electrical connection with the electrical raft (for example, in electrical connection with at least one of the electrical conductor(s) embedded in the electrical raft). The electrical raft is mechanically fixed to the gas turbine engine. The electronic unit (for example at least a part of a surface of the electronic unit) forms at least a part of a gas-washed surface of the gas turbine engine.

Also according to an aspect, there is provided a method of attaching an electronic unit to a gas turbine engine, the gas turbine engine comprising an electrical raft having a rigid material with at least one electrical conductor embedded therein. The method comprises slotting the electronic unit into an opening formed in a gas-washed surface of the gas turbine engine. The method comprises electrically connecting the electronic unit to the electrical raft. A surface of the electronic unit, when inserted into the opening according to the method, is a gas-washed surface that completes the gas-washed surface in which the opening is formed. The method may be performed, for example, as part of an assembly and/or repair/overhaul/maintenance process.

The electronic unit may be any type of electronic control unit, and may be referred to herein as an electronic control unit, or ECU, such as, for example, an EEC or an EMU. By way of further example, the electronic unit may be an ignitor/ignitor box, an oil debris management unit, a magnetic chip detector and/or at least a part of a diagnostic unit. The electronic unit that is mounted on the electrical raft may or may not be mechanically fixed to the electrical raft. The electrical raft may be at least a part of an electrical harness for a gas turbine engine, and thus may be referred to herein as an electrical harness raft. The ECU may be said to be in electrical contact (or connection) with at least one of the at least one conductors embedded in the rigid material.

According to such an arrangement/method, the ECU may be accessible, for example directly accessible, from the assembled engine. For example, such an arrangement may mean that the ECU can be removed/installed to/from the engine without the need to have dedicated access panels, such as fan cowl doors. Thus, repair/maintenance procedures may be speeded up and/or facilitated, and/or weight may be saved from the engine. Design of the gas-washed surface(s) of the engine may be simplified because the need for access panels may be removed, for example because moveable parts, such as latches and hinges, may no longer be required. Thus, the gas-washed surfaces, such as the nacelle (for example), may be lighter, cheaper and quicker to build/assemble. They may also have improved tolerance, for example dimensional tolerance, because of the reduced design constraints, and thus split lines/gaps on gas-washed surfaces may be reduced, leading to reductions in drag and thus improvements in fuel consumption if the engine is attached to a vehicle, such as an aircraft. Furthermore, such an arrangement may improve the cooling of the ECU due to the flow over the gas-washed surface and/or allow the ambient temperature of the gas surrounding the ECU to be lower. This may improve reliability and/or service life of the ECU and/or reduce/eliminate the need to provide dedicated cooling arrangements.

The gas turbine engine may be any type of gas turbine engine, for any application. Thus, for example, the gas-washed surface may be a surface over which gas flows during use and/or, for example, may simply be a surface that is exposed to the gas that surrounds the engine during use, for example an external surface that encloses parts of the engine, such as en external surface that points away from the engine or forms a part of a bypass flow passage of a turbo fan engine. The gas-washed surface may be referred to as an external surface of the engine.

The electrical conductors embedded in the rigid material may be used to transfer electrical signals around a gas turbine engine. Using a electrical raft having electrical conductors embedded therein to enable the ECU to be mounted to the engine to form at least a part of a gas-washed surface may have many advantages, at least some of which are described herein.

Any suitable material may be used for the rigid material of the electrical raft. For example, the rigid material may be a rigid composite material, for example an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any combination of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

At least some (for example a plurality) of the electrical conductors may be provided in a flexible printed circuit (FPC), which may be referred to as a flexible printed circuit board (FPCB). Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may or may not be sheathed) and/or one or more flexible printed circuits embedded therein. As such, a given electrical raft may have wires and flexible printed circuits laid therein, either or both of which may be electrical conductors.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

The electrical raft may be provided with a first electrical connector in electrical contact with at least one of said embedded electrical conductors. The first electrical connector may be fixed relative to the electrical raft. The electronic unit may be provided with a second electrical connector, which may be complimentary to the first electrical connector. The second electrical connector may be fixed relative to the electronic unit. The electrical raft and the electronic unit may be in electrical connection through the first and second electrical connectors. The first and/or second electrical connectors may thus be fixed (for example they may have no degrees of freedom of movement) relative to the respective component to which they are provided.

The electronic unit and the electrical raft may thus comprise complimentary connectors, which may be configured such that the step of electrically connecting the electronic unit to the electrical raft is performed automatically when slotting the electronic unit into place, for example into the opening in the gas-washed surface of the engine.

Such an arrangement/method may further facilitate the electrical connection of the ECU to the engine and/or the electrical disconnection of the ECU from the engine. For example, because the positions and/or orientations of the respective electrical connectors may be known, the ECU may simply be slotted into place from outside the engine during assembly and/or maintenance.

When the electronic unit is attached to the electrical raft, the respective connectors may not be exposed to the region outside the electrical assembly. In other words, the respective connected electrical connectors may be contained within the electrical raft assembly. This may help to protect the connectors from damage and/or degradation.

The electronic unit may be mechanically fixed to the gas turbine engine, i.e. to another component of the gas turbine engine. The other component could be any component of the gas turbine engine, which may or may not include the electrical raft. According to this arrangement, the mechanical attachment of the ECU to the engine may be different to (or separate from) the electrical connection of the ECU to the engine. This may allow the electrical connection of the ECU to the raft to be optimized without being constrained by mechanical fixing requirements. Similarly, the mechanical fixing can be optimized with being constrained by electrical connection requirements. In this way, the electrical connection may be particularly resilient, for example maintaining electrical connection during vibration.

The electronic unit and the electrical raft may be mechanically fixed to different components of the gas turbine engine. This may be particularly convenient depending on the geometry. For example, it may allow the electrical raft to be mechanically fixed to a surface that may not be visible once the electronic unit is in position. Thus, for example, an electronic unit could be mechanically fixed to a nacelle, whereas the electrical raft could be mechanically fixed to a fan case.

The electronic unit may form at least a part of an external gas-washed surface that, in use, is gas-washed by the free-stream flow. Such an external gas-washed surface may be said to be on the outside of the gas turbine engine and/or to face away from the gas turbine engine. The free-stream flow may be said to be flow that does not pass through the gas turbine engine in use, but rather passes around the engine. Such an arrangement may be particularly beneficial because it may allow such an external surface to be designed without being constrained by the need to have access panels for the ECU. An example of such a surface is the outer surface of the nacelle of a turbofan engine. Thus, the gas turbine engine may comprise a nacelle, and the electronic unit may form a substantially continuous gas-washed surface with the nacelle.

The gas turbine engine may be a turbofan gas turbine engine having a bypass duct. The electronic unit may form at least a part of a gas-washed surface of the bypass duct. Such a gas-washed surface may be referred to as an internal gas-washed surface. Depending on the engine, this may be a convenient region from which to access and/or in which to locate an electronic control unit.

The electrical raft may be mounted inside the nacelle, for example of a turbofan engine. This may mean that the electrical raft is embedded in the nacelle and/or mechanically fixed inside the nacelle, for example fixed to a fan case. In this way, the electrical raft can be provided in a convenient location for the ECU to be connected to the engine. The electrical raft may be mounted inside the nacelle such that the ECU can be attached thereto either to form an external (i.e. outwardly facing) gas-washed surface or an internal (i.e. inwardly facing) surface, such as a surface of a bypass duct.

The electrical assembly may form part of a gas turbine engine electrical system. The electrical raft may comprise a linking electrical connector (which may be different to an electrical connector used for connecting the electrical raft to the ECU) through which the electrical assembly may be electrically connected to the rest of the gas turbine engine electrical system. The linking electrical connector may be used to connect the electrical raft to any other electrical component in any suitable way. For example, it may be used to electrically connect the electrical raft of the electrical assembly to another electrical raft, either directly (for example through a complimentary connector on another raft) or indirectly (for example via a linking wire/cable). Thus, the electrical raft may be said to be part of an electrical harness for transferring electrical signals around the engine, in the form of electrical harness raft(s) and/or electrical harness raft assemblies. The electrical harness may comprise other electrical rafts.

Thus, the gas turbine engine may comprise at least one flexible cable electrically connected to the linking electrical connector of the electrical raft and to the rest of the gas turbine engine electrical system. In this way, the flexible cable may be used to electrically connect the electrical assembly to the rest of the gas turbine engine electrical system. The flexible cable may be a flexible printed circuit (FPC or FPCB), having electrical conductors provided in a flexible substrate.

Accordingly, there is provided (and aspects of the invention may be used with/as a part of) a gas turbine engine comprising an electrical system arranged to transfer electrical signals around the engine. The electrical system comprises an electrical raft comprising multiple electrical conductors embedded in a rigid material, the electrical harness raft forming a first engine installation component. The electrical system also comprises a second engine installation component comprising electrical conductors. The electrical system also comprises at least one flexible cable connected between the electrical harness raft and the second engine installation component so as to electrically connect electrical conductors of the electrical harness raft with electrical conductors of the second engine installation component.

The environment of a gas turbine engine during operation may be particularly severe, with, for example, high levels of vibration and/or differential expansion between components as the temperature changes through operation and as the components move relative to each other. Providing at least one flexible cable to connect an electrical raft to another component may allow the electrical rafts and/or components to accommodate vibration and/or relative movement, for example of the component(s)/assemblies to which they are attached/mounted during use. For example, the flexible cable(s) used to electrically connect electrical raft(s) to other component(s) may have sufficient length to accommodate such vibration and/or movement during use.

For example, providing separate (for example more than one) electrical rafts and connecting at least some (for example at least two) of them together using at least one flexible cable may allow the electrical rafts to accommodate vibration and/or relative movement of the component(s)/assemblies to which they are attached/mounted during use.

The engine may comprise one or more electrical rafts as appropriate. Thus, in addition to the electrical raft on which the electronic unit is mounted to form the electrical assembly, other electrical rafts may be provided, which themselves may or may not be part of an electrical assembly. Using an electrical raft having electrical conductors embedded therein, either as part of an electrical assembly or elsewhere in the engine, may have various advantages. For example, the electrical rafts may provide greater protection to the electrical conductors than a conventional harness.

For example, the rigid and/or hard material in which the conductors are embedded may provide greater protection (for example greater mechanical protection) to the embedded conductors, for example due to being resistant to breaking and/or snapping and/or piercing and/or puncturing. Purely by way of example, the use of electrical rafts may reduce, or substantially eliminate, the chance of foreign bodies coming into contact with the electrical conductors, for example through fluid ingress. The electrical raft(s) may provide improved protection to the electrical conductors during manufacture/assembly of the raft/electrical assembly/ gas turbine installation, and/or during service/operation/ maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

Use of one or more electrical rafts (for example as a part of the electrical assembly or otherwise) may significantly reduce build time of an engine. For example, use of electrical rafts may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Connection between the rafts and other electrical components using flexible cable(s) and/or direct connection may be particularly convenient and straightforward. Thus, use of an electrical raft in a gas turbine engine may reduce assembly time and/or reduce the possibility of errors occurring during assembly.

Use of one or more electrical rafts may provide significant advantages during maintenance, such as repair and overhaul, for example in addition to those advantages discussed in relation to the accessibility of an ECU that is mounted on an electrical raft so as to form at least a part of a gas-washed surface. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional electrical harnesses. Use of electrical rafts may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts/electrical assemblies comprising electrical rafts prior to engine assembly. This may allow the electrical and/or mechanical operation of the electrical rafts to be proven before installation, thereby reducing/eliminating the testing required during engine installation.

Accordingly, there is provided (and aspects of the invention may be used with/as a part of) a method of servicing a gas turbine engine, the method comprising: removing a first rigid raft from the gas turbine engine, the rigid raft incorporating at least a part of at least one component or system of the gas turbine engine; and installing a second, pre-prepared, rigid raft onto the gas turbine engine in place of the first rigid raft. The first and second rigid rafts may be electrical rafts (such as electrical harness rafts) having electrical conductors embedded in a rigid material. The electrical conductors may be at least a part of an electrical system arranged to transfer electrical signals around the engine.

The electrical raft may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires and/or insulating sleeves would be required. The reduced weight may be particularly advantageous, for example, when used on gas turbine engines on aircraft.

Electrical rafts may be more easily packaged and/or more compact, for example than conventional harnesses. Indeed, the electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft is attached, such as a fan casing or a core casing.

It will be appreciated that the electrical signals transferred by the conductors in the electrical raft(s), and around the engine using the electrical rafts/raft assemblies may take any form. For example, the electrical signals may include, by way of non-imitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine or a related (for example electrically and/or mechanically connected) structure/component/system.

Electrical rafts may be provided in any suitable location/position of the gas turbine engine, for example as part of the electrical assembly including an electronic control unit or otherwise and optionally also in addition to the electrical assembly. For example, the gas turbine engine may comprise a bypass flow duct formed between an engine core and an engine fan casing (the gas turbine engine may be a turbofan engine, for example), and an electrical raft may be used to form at least a part of a radially extending splitter (which may be referred to as a bifurcation) that extends across the bypass flow duct. In this way, an electrical raft (which may be referred to as a splitter electrical raft) may provide an electrical connection between a fan casing and an engine core.

An electrical raft may, have components and/or parts of other systems embedded therein, such as fluid passages (or pipes) that may form a part of a fluid system, for example for carrying a gas (such as cooling air, sealing air, and/or muscle air (for example for pneumatic systems)) and/or a liquid (such as fuel, water, oil and/or hydraulic fluid). Accordingly, there is provided (and aspects of the invention may be used with/as a part of) a rigid raft assembly for a gas turbine engine, the rigid raft assembly comprising a rigid material that carries at least a part of a first gas turbine engine system and at least a part of a second gas turbine engine system, wherein: the first gas turbine engine system is a fluid system that comprises at least one fluid passage that is at least partially embedded in the rigid raft assembly. The second gas turbine engine system may be an electrical system that comprises electrical conductors at least partially embedded in the rigid material. Thus the rigid raft assembly may be an electrical rigid raft assembly.

An electrical raft may be mechanically and/or electrically connected to other components/systems of the gas turbine engine, for example ancillary, auxiliary or control components. Such other components/systems may be provided to a suitable electrical raft in any suitable manner. For example, such other components/systems may be mounted on one or more electrical rafts. Thus, a suitable surface of an electrical raft may be used as a mounting surface for other gas turbine engine components/systems, such as ancillary/auxiliary components/systems.

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to a suitable electrical raft (for example mechanically mounted using a bracket), and thus to the engine. The fluid pipes may be arranged to carry any fluid as desired, including gas (such as cooling air, sealing air, and/or muscle air (for example for pneumatic systems)) and/or liquid (such as fuel, water, oil and/or hydraulic fluid). Of course, more than one set of fluid pipes, for example for carrying different or the same fluids, may be mounted on the same electrical raft.

Examples of other components/systems that may be at least in part mounted to an electrical raft include, by way of non-limitative example: fire detectors and/or fire detection elements; thermocouples for measuring air temperature (for example within a particular engine zone); vibration monitoring processing equipment (for example a signal processing component/box containing electronics used to process a vibration signal that may be measured elsewhere in the engine); equipment for measuring fluid quality (for example a probe for oil debris monitoring may be provided to one or more pipes mounted to the raft, and/or a signal processing box for processing the oil quality measurements may be mounted on the box); and pressure sensors and/or signal processing equipment, for example for fluid pipes mounted on the rafts. At least some of these components/systems may form be electrically connected to the electrical conductors in the electrical raft, for example using one or more electrical connectors of the electrical rafts, and may form an electrical assembly.

At least one electrical raft (which may or may not be an electrical raft that has an electronic unit mounted thereon to form the electrical assembly) may be connected/attached/mounted to the gas turbine engine using at least one anti-vibration mount. Using an anti-vibration mount to attach an electrical raft/assembly to the gas turbine engine may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (for example the ECU forming a part of the electrical assembly, or any other component/system as discussed above and elsewhere herein) may also benefit from being mounted to the gas turbine engine via the anti-vibration mounts, through being mounted on the electrical raft. The reduced vibration may help to preserve the electrical contact between the electrical raft and any electronic unit connected thereto. As such, any components (such as the electronic unit mounted to the electrical raft in the electrical assembly) that might conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
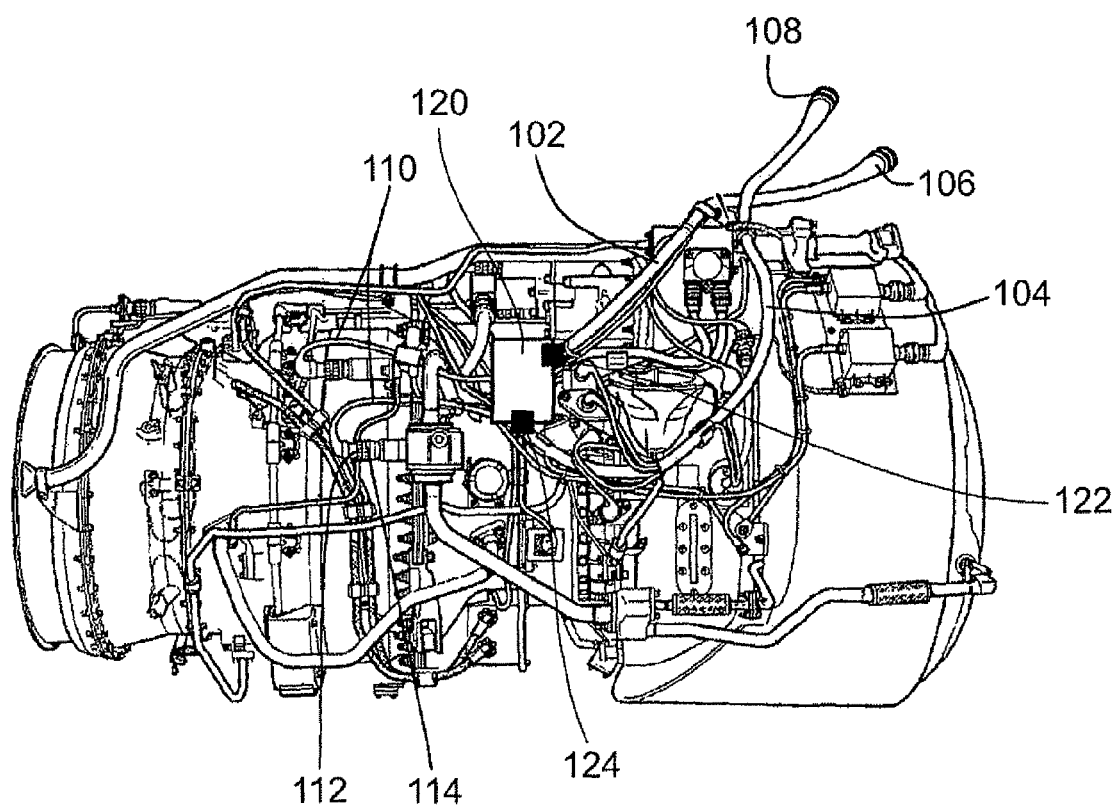
FIG. 1 shows a gas turbine engine with a conventional harness.
Figure 2:
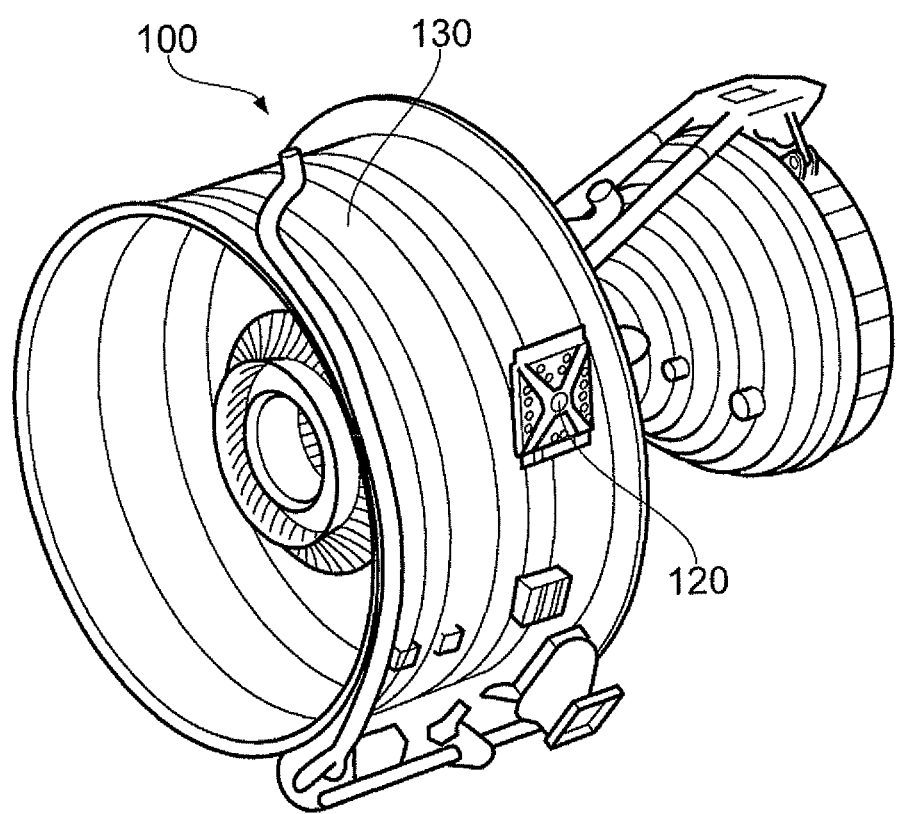
FIG. 2 shows a gas turbine engine with a conventionally mounted ECU.
Figure 3:
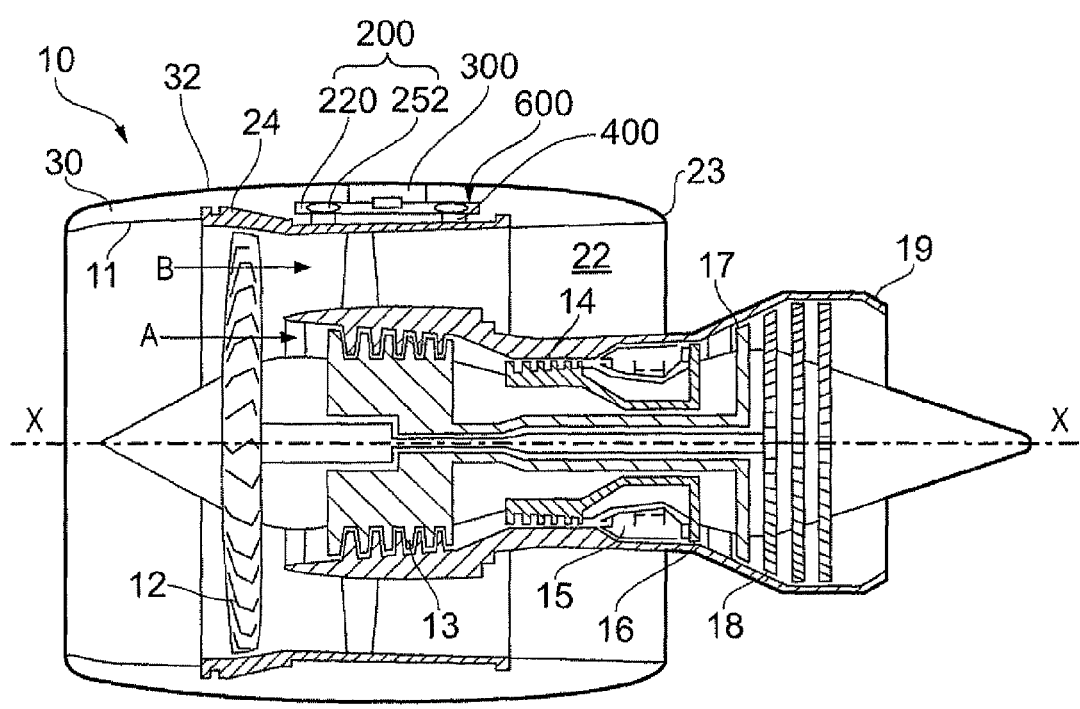
FIG. 3 shows a cross-section through a gas turbine engine having an electrical assembly in accordance with an example of the invention.

With reference to FIG. 3, a ducted fan gas turbine engine (which may be referred to as a turbofan engine) generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23. The example turbofan engine 10 shown in FIG. 3 has a fan case 24 and a nacelle 30. The nacelle 30 at least partially surrounds the fan case 25. The nacelle 30 has an outer surface (or skin) 32.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 3 comprises at least one electrical assembly 600 according to an example of the present invention. As such, the gas turbine engine 10 of FIG. 3 is in accordance with an example of the present invention. The electrical assembly 600 comprises an electrical raft 200. The electrical raft 200 may be used to transmit/transfer electrical signals (or electricity, including electrical power and/or electrical control signals) around the engine and/or to/from the engine 10 from other components, such as components of an airframe. The function and/or construction of the electrical raft 200 and electrical assembly 600 may be as described above and elsewhere herein.

In FIG. 3, the electrical raft 200 (which may be referred to herein simply as a raft 200 or an electrical harness raft 200) comprises at least one electrical conductor 252 embedded in a rigid material 220, which may be a rigid composite material. In the FIG. 3 arrangement, the electrical raft 200 is provided with an electronic unit 300. The electronic unit 300 may be any electronic unit, such as an electronic control unit (ECU). Examples of electronic units 300 are provided elsewhere herein, and include (by way of example only) EEGs and EMUs. The electrical raft 200 and the electronic unit 300 together form the electrical assembly 600. In some embodiments, the electrical raft 200 (or the electrical assembly 600) may be provided with other gas turbine components/systems, such as fluid pipes or conduits forming at least a part of a fluid system. Such fluid pipes may be attached to the electrical raft 200 using mounting brackets. Additionally or alternatively, such fluid pipes may be embedded in the electrical raft 200.

The electrical raft 200 (or the electrical assembly 600) may be attached to the rest of the gas turbine engine 10 using mounts 400, which may be anti-vibration (AV) mounts configured to reduce or substantially eliminate vibration from components of the gas turbine engine 10 being passed to the electrical raft 200, and thus to any components/systems 300 mounted thereon/connected thereto. In the FIG. 3 example, the electrical raft 200 is connected (for example mechanically attached) to the fan case 24. However, the electrical raft 200 may be connected to other components of the gas turbine engine 10. Indeed, some examples may not include a fan case 24.

Figure 4:
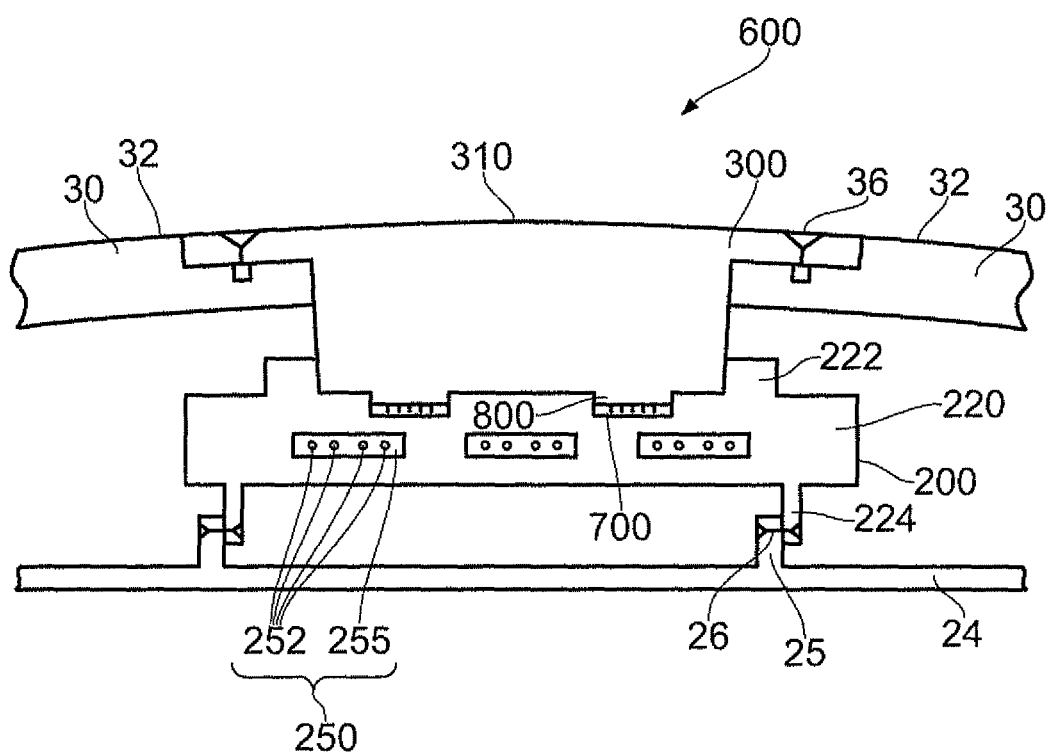
FIG. 4 shows an electrical assembly according to an example of the present invention.

FIG. 4 is a more detailed view of the electrical assembly 600. The electrical assembly 600 comprises an electrical raft 200 and an electronic unit (or ECU) 300. In the FIG. 4 example, the electrical raft 200 comprises multiple conductors 252 provided as part of a flexible printed circuit (FPC) 250. As described in greater detail below, for example in relation to FIGS. 7 and 8, the conductors 252 in such an FPC 250 are provided in (for example embedded in) flexible (for example elastically deformable) substrate 255. The FIG. 4 example comprises three FPCs, each comprising four conductors 252. However, the electrical raft 200 may comprise any number of FPCs 250 (for example 1, 2, 3, 4, 5, 6, 7, 8, 9, 10 or more than 10), and each FPC may comprise any number of electrical conductors 252 (for example for example 1 or more, 10 or more, 100 or more, or 1000 or more). Alternatively or additionally, the electrical conductor(s) may be provided in any other suitable way. For example, in addition to or as an alternative to the FPCs 250, the conductors 252 may be provided as conductive wires or tracks (which may or may not be sheathed) laid (for example directly laid) into the rigid material 220.

The conductors 252 are provided in, for example embedded in, a rigid material 220 to form the electrical raft 200, as described in more detail elsewhere herein. The electrical raft 200 is provided with at least one electrical connector 700. Each electrical raft 200 may comprise any suitable number of electrical connectors 700. The or each electrical connector 700 may be in electrical contact with at least one of the embedded electrical conductors 252 (although the electrical connection between the electrical connector 700 and the electrical conductors 252 is not shown in the section shown in FIG. 4). Thus, electrical signals may pass into and out of the electrical raft 200 via the electrical connector 700.

The electrical connector 700 may take any suitable form. For example, it may be a male connector or a female connector. The electrical connector 700 may be arranged to cooperate with (for example electrically connect to) a complimentary connector. The electrical connector 700 may be fixed in position relative to the rest of the electrical raft 200.

The electrical connector 700 may be configured to connect with a complimentary connector 800 provided on the ECU 300, which may be fixed in position relative to the rest of the ECU 300. Thus, the electrical assembly 600 may comprise the ECU 300 and the electrical raft 200 electrically connected together through their respective electrical connectors 800/700. When the ECU 300 is fitted into position, the electrical connection may be automatically formed between the ECU 300 and the electrical raft 200, for example via the electrical connectors 800/700.

When the ECU 300 is in position, for example when it is assembled with the engine 10, at least a part of it forms at least a part of a gas-washed surface. A gas-washed surface may be a surface which is exposed to the gas surrounding the engine when assembled including, for example, gas passing through a bypass duct 22 of a turbofan gas turbine engine 10 or gas passing around the outside of a gas turbine engine 10. Thus, in an application in which the engine moves relative to the surrounding gas when in use (for example an engine used to propel a vehicle, such as an aircraft), the gas-washed surface may be a surface which, when the engine is in use, moves through the gas, which may be a working fluid. In other words, in the frame of reference of the gas-washed surface, the gas may be said to move over, or "wash over" the gas-washed surface in use in such an example.

For example, a surface 310 of the ECU 300 may form a part of a gas-washed surface 32 of the nacelle 30 of a gas turbine engine, as in the example shown in FIG. 4. The surface 310 of the ECU 300 may be said to complete a gas-washed surface, or to fill a gap in a gas-washed, for example to complete or fill a gap in the gas-washed surface 32 of the nacelle 30.

The gas-washed surface 310 of the ECU 300 may form a substantially continuous and/or contiguous surface with a surrounding/neighbouring gas-washed surface. In FIG. 4, the gas-washed surface 310 of the ECU 300 forms a substantially continuous and contiguous surface with the gas-washed surface 32 of the nacelle 30. Such a continuous and/or contiguous surface may help to improve aerodynamic performance, for example by reducing the drag coefficient, and thus improving fuel consumption if the engine 10 is used to propel a vehicle, such as an aeroplane. The surface 310 may be made to be continuous and/or contiguous with the surrounding gas-washed surface 32 in any suitable way, for example it may be a tight/flush fit in the opening in the surrounding surface(s), and/or may be provided with flaps/extensions to cover any gaps between the gas-washed surfaces 32/310.

In FIG. 4, the gas-washed surface 310 of the ECU 300 forms part of an outwardly facing surface, i.e. it fills a gap in the outwardly facing surface 32 of the nacelle 30. The outwardly facing surfaces 32/310 may face away from, or outwardly from, the rest of the engine 10. Such outwardly facing surfaces may be referred to as external gas-washed surfaces. However, the position of the surface 310 shown in FIG. 4 is by way of example only, and the surface 310 may form a gas-washed surface in any suitable position of the engine 10. Examples of other positions/arrangements of the ECU 300 and its gas-washed surface are provided elsewhere herein, for example in relation to FIGS. 5 and 6.

In the FIG. 4 arrangement, the ECU 300 is attached, for example mechanically fixed/attached/mounted, to the nacelle 30 using fixings 36. Any suitable method could be used to attach the ECU 300 to the nacelle 30. The electrical raft 200 is attached, for example mechanically fixed/attached/mounted, to the fan case 24. Thus, the electrical raft 200 and the ECU 300 may be attached to different parts/ components of the engine 10, as in the FIG. 4 arrangement. However, in alternative arrangements, the raft 200 and the ECU 300 may be attached to the same part/component of the engine 10. By way of example only, both the electrical raft 200 and the ECU 300 may be attached to just one of the nacelle 30 or the fan case 24. Indeed, attaching the electrical raft 200 and the ECU 300 to the same component may be advantageous in some arrangements, for example by negating any possible impact of differential movement/vibration that may result from attachment of the electrical raft 200 and ECU 300 to different components (although this effect may be negligible/non-existent in some cases).

The fan case may be any type of fan case, for example a fan blade containment case. Any suitable fixture 26 may be used to attach the electrical raft 200 to the fan case 24. For example, in the FIG. 4 arrangement, the fan case 24 has one or more protrusions 25 that correspond(s) with one or more protrusions 224 of the electrical raft 200, the two protrusions 224/25 being mechanically fixed together using a fixture 26. However, any suitable fixture may be provided to the fan case 24 and/or the electrical raft 200 to mechanically fix them together. An anti-vibration mount may be used to attach the electrical raft 200 to the fan case 24.

The ECU 300 and/or the electrical raft 200 may be provided with one or more locating features. Such locating features may assist in locating the ECU 300 in the correct position relative to the electrical raft 200, for example when installing the ECU. For example, the FIG. 4 arrangement has locating protrusions 222 extending from the electrical raft 200, but any suitable locating protrusions may (or may not) be provided.

The ECU 300 may be attached to the gas turbine engine in any suitable way. In FIG. 4, the ECU 300 is attached to the nacelle 30 using at least one fixture 36, which passes through a joggle arrangement formed by the ECU 300 and the nacelle 30. However, it will be appreciated that any suitable fixing arrangement could be used.

The ECU 300 may be efficiently/effectively cooled by gas flow over the exposed surface 310 in embodiments in which the flow washes over the surface 310 during use. However, if additional cooling is required, cooling fins could optionally be provided to the surface 310 of the ECU 300. Such fins (which may take any shape/from and are not shown in the Figures) may extend away from the surface 300 into the flow to provide additional heat transfer, and thus additional cooling.

Figure 7:
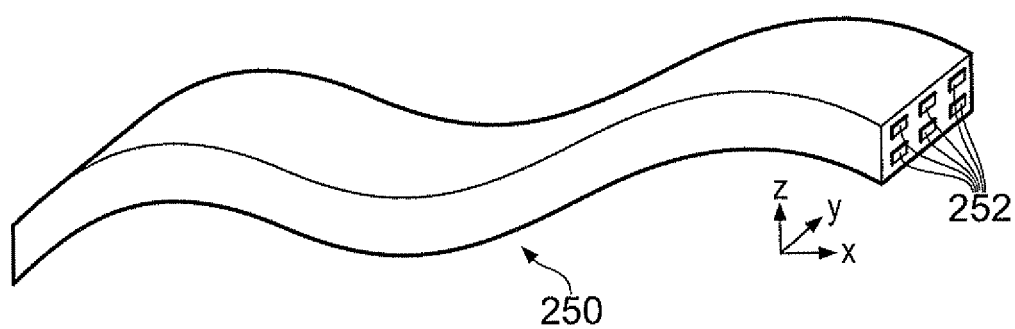
FIG. 7 shows a perspective view of a flexible printed circuit.
Figure 8:
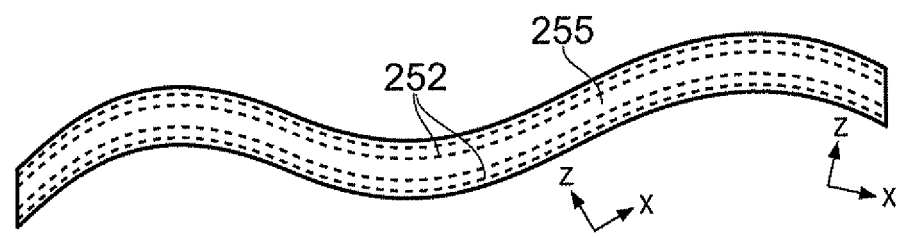
FIG. 8 shows a side view of the flexible printed circuit of FIG. 7.

As mentioned herein, the electrical conductors 252 in the electrical raft 200 may themselves be provided in a harness 250, which may be a flexible printed circuit board (or FPC) 250, as with the electrical raft 200 of FIG. 4. An example of an FPC 250 in which the electrical conductors 252 may be provided is shown in greater detail in FIGS. 7 and 8. FIG. 7 shows a perspective view of the FPC 250, and FIG. 8 shows a side view. In both FIGS. 7 and 8, the FPC 250 is not shown as part of an electrical raft 200, but the FPC 250 could be embedded in a rigid material 220 to form an electrical raft 200.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 7 and 8, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 8. The x-y surface(s) (ie the surfaces formed by the x and y directions) may be said to be the major surface(s) of the FPC 250. In the example shown in FIGS. 7 and 8, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the electrical raft 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 7 and 8 has 6 conductive tracks 252 running through the substrate 255. However, as mentioned above, an FPC could be provided with any suitable number of tracks 252. For example, the number of conductive tracks 252 running through a substrate 255 could be fewer than 6, or greater than 6. Indeed the number of conductive tracks 252 could be far greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 7 and 8 comprises 2 layers of tracks, with each layer comprising 3 tracks 252.

An electrical raft 200 as described and claimed herein may be manufactured using any suitable method. For example, the rigid material 220 may initially be provided as layers of flexible material, such as (by way of example only) layers of fibre and resin compound, examples of which are given elsewhere herein. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 9:
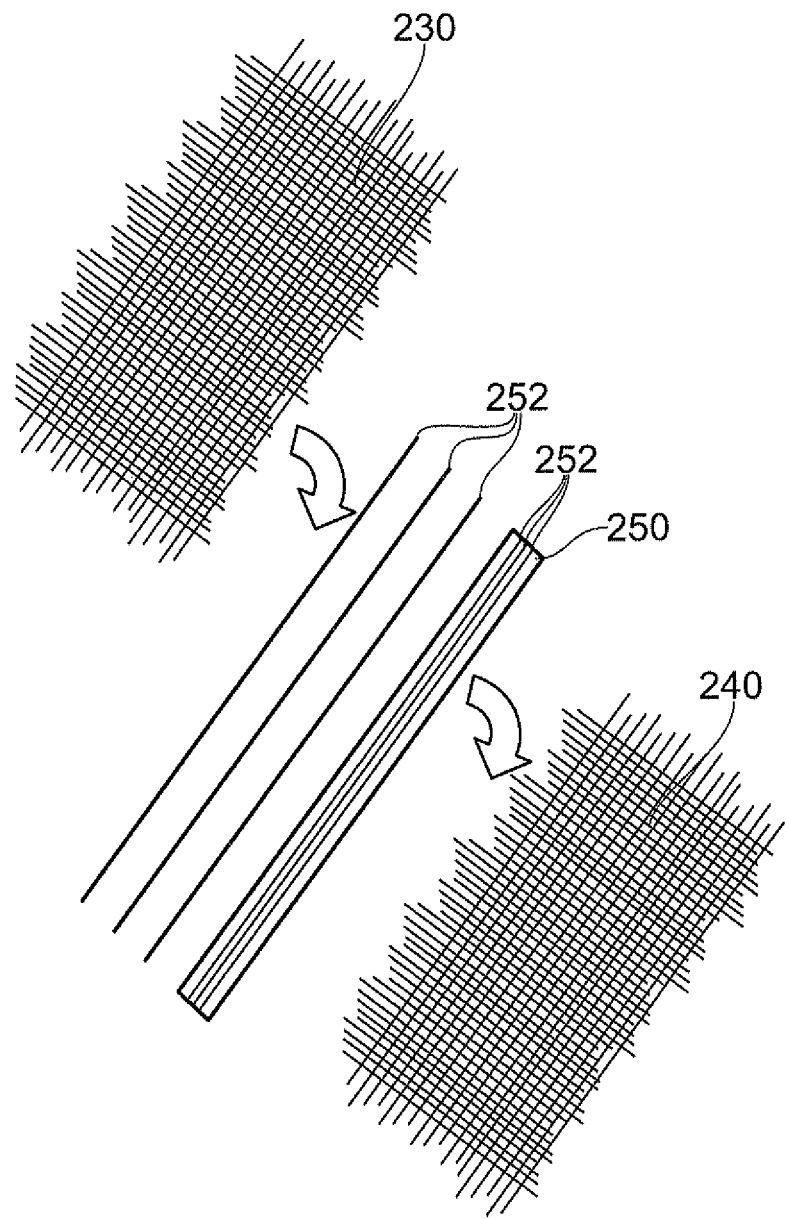
FIG. 9 shows a schematic of an electrical raft prior to assembly.

FIG. 9 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 9, the fibre and resin compound is formed of a sheet of interwoven fibres, or strands. The strands in FIG. 9 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final electrical raft 200 to adopt shapes that are curved in two-dimensions or three-dimensions.

Other suitable methods could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. Indeed, in some constructions no fibre may be used at all in the rigid material 220.

After the treatment, the electrical raft 200 may be set in the desired shape. Electrical connectors 700 may be provided to the electrical raft 200 at any suitable time during manufacture, for example prior to any stiffening treatment of the rigid raft assembly 200, or after such treatment. For example, the or each connector 700 may be fixed (for example bonded) into an appropriate recess in the electrical raft 200. Such a recess may be formed using a correspondingly shaped mould, or may be formed (for example by machining or boring) after the rigid electrical raft 200 is set.

Alternatively, the electrical connector(s) 700 may be embedded directly into the electrical raft 200 during the forming and setting of the electrical raft 200. As such, the rigid material 220 may set around the electrical connector(s) 700, thereby fixing them into position. In this case, the electrical conductors 252 may be in electrical contact with the electrical connector(s) 700 prior to the rigid material 220 being set around them.

Figure 5:
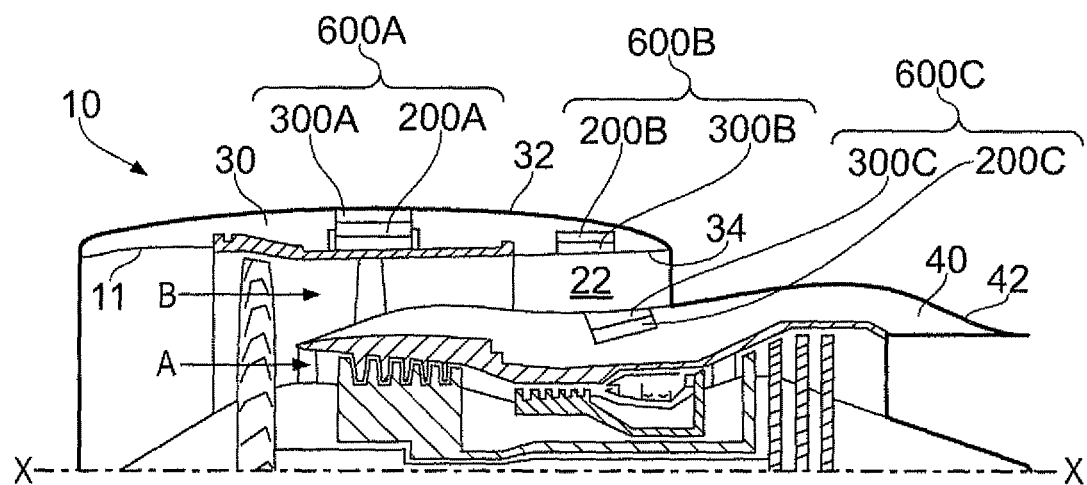
FIG. 5 shows examples of positions of an electrical assembly in a gas turbine engine according to examples of the present invention.

As mentioned elsewhere herein, an electrical assembly 600 could be provided in any suitable location on the engine 10, for example in any suitable location in which at least a part of the ECU 300 forms at least a part of a gas-washed surface. FIG. 5 illustrates, by way of example only, 3 different possible positions of an electrical assembly 600 on a turbofan gas turbine engine 10. The three different positions are indicated by the three electrical assemblies 600A, 600B, 600C. A gas turbine engine 10 may have an electrical assembly 600 in any one or more of the positions generally indicated by the electrical assemblies 600A, 600B, 600C, and/or in any other suitable location.

Each of the electrical assemblies 600A, 600B, 600C comprises a respective electrical raft 200A, 200B, 200C and a respective electronic unit (such as an ECU) 300A, 300B, 300C. The general arrangement of the electrical assembly 600A, 600B, 600C may be, for example, as described elsewhere herein, for example in relation to the respective rafts 200A, 200B, 200C and the respective electronic units 300A, 300B, 300C. As such, the construction of the electrical assemblies 600A, 600B, 600C will not be described in greater detail in relation to FIG. 5.

The position of the electrical assembly 600A is similar to that described above in relation to FIG. 4. Thus, the electronic unit 300A of the electrical assembly 600A has an outwardly facing (or external) gas-washed surface.

The electrical assembly 600B is also provided in the nacelle 30. However, a gas-washed surface (not labelled) of the electronic unit 300B of the electrical assembly 600B forms a part of the bypass duct 22, and thus may be referred to as an inwardly facing (or internal) gas-washed surface. The gas-washed surface of the electronic unit 300B may complete, or fill a gap in, a surface 34 of the nacelle 30 that is gas-washed by the bypass flow in the bypass duct 22. The surface 34 of the nacelle 30 and the gas-washed surface of the electronic unit 300B may form an outer annular surface of the bypass duct 22.

The electrical assembly 600C is provided in a core cowling, or core fairing, 40. A gas-washed surface of the electronic unit 300C of the electrical assembly 600C may complete, or fill a gap in, a surface 42 of the core cowling 40, at least a part of which is gas-washed by the bypass flow in the bypass duct 22. The surface 42 of the core cowling 40 and the gas-washed surface of the electronic unit 300C may form an inner annular surface of the bypass duct 22. However, the electrical assembly 600C may be place anywhere along the core cowling 40, for example at a position downstream of the trailing edge of the nacelle 30. Thus, the gas-washed surface of the electronic unit 300C may or may not form a part of the inner annular surface of the bypass duct 22. Indeed, although all of the electrical assemblies 600A, 600B, 600C are shown in locations downstream of the fan, this need not be the case. For example, the electrical assemblies 600A, 600B may be placed in the nacelle 30 at a position upstream of the fan.

Figure 6:
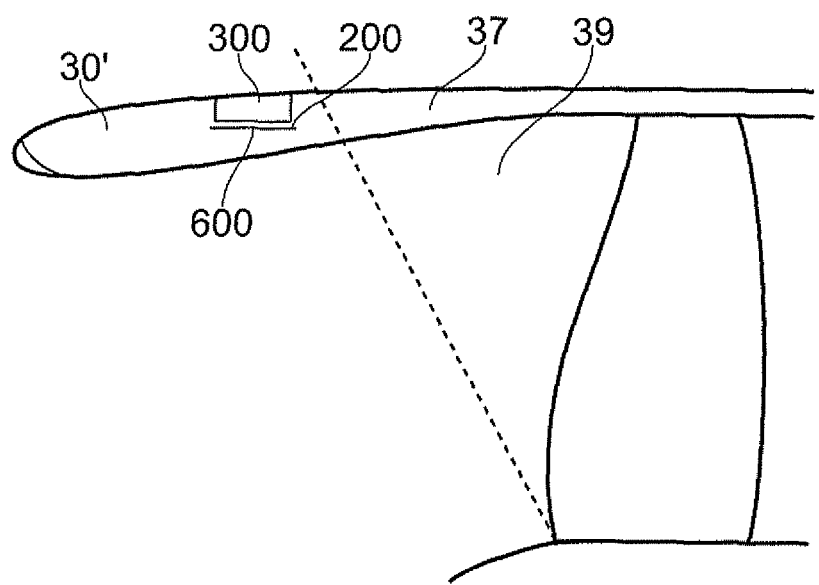
FIG. 6 shows an electrical assembly and part of a gas turbine engine according to an example of the present invention.

An electrical assembly 600 such as that described by way of example herein may be provided to any engine, for example any gas turbine engine. FIG. 6 shows an arrangement in which an electrical assembly 600 is provided to a gas turbine engine in which the nacelle 30' itself provides the fan containment system. Such an arrangement may not have a fan case 24. Instead, the nacelle 30' may be filled with a containment structure 37, which may, for example, be a honeycomb and/or composite structure. In such an arrangement, the electrical assembly 600 may be provided in a cut-out, or pocket, in the filled nacelle 30'. The position of the electrical assembly 600 in such an arrangement may be chosen to be out of the potential blade impact zone 39 for safety. The electrical assembly 600 (in any embodiment) may be placed sufficiently far back from the leading edge of the nacelle 30/30' to reduce/substantially eliminate the possibility of damage from foreign object strike, such as bird strike.

Figure 10:
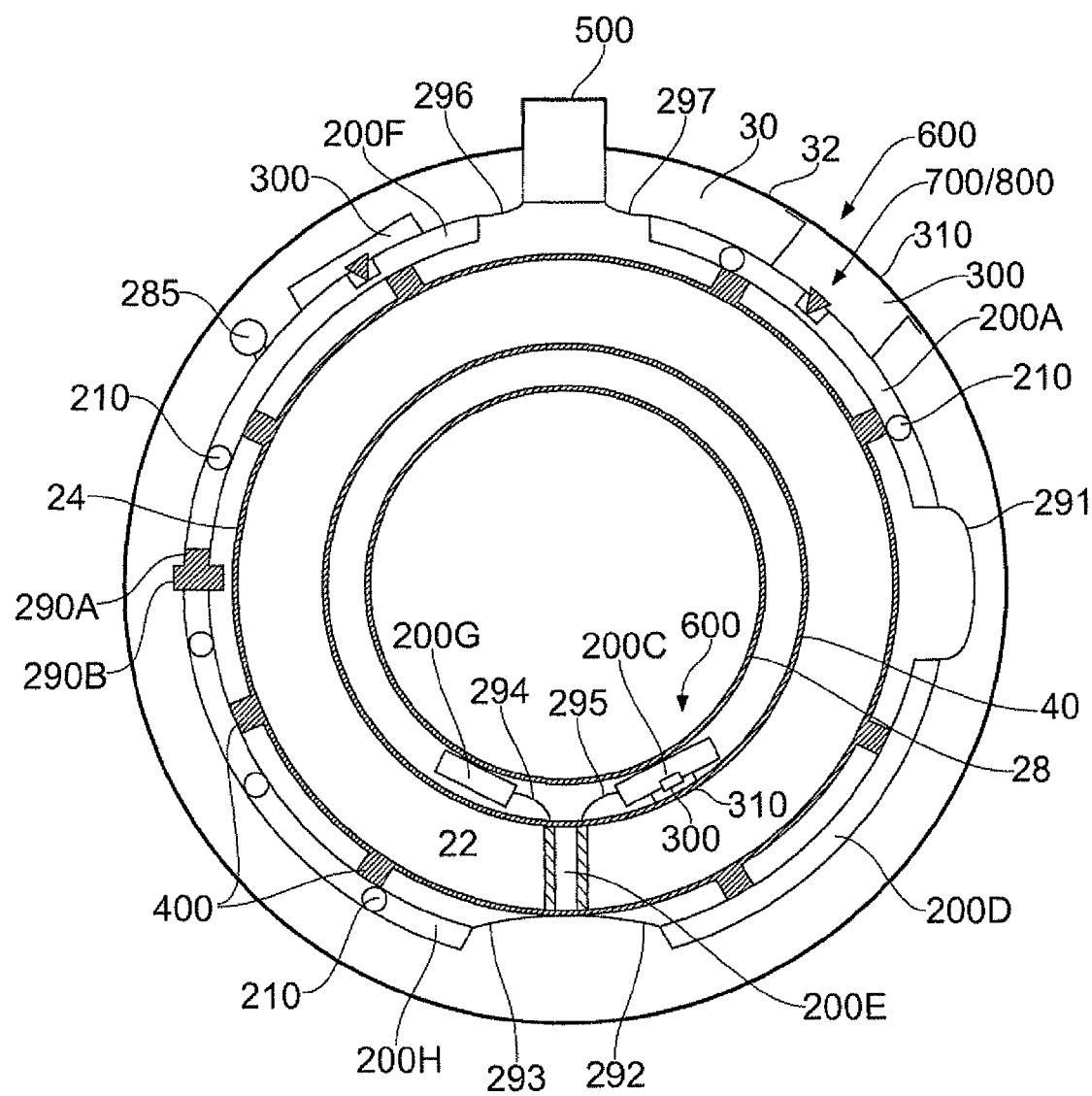
FIG. 10 shows a cross-section normal to the axial direction through a gas turbine engine according to an example of the invention.

FIG. 10 is a schematic showing a cross-section perpendicular to the axial direction X-X of a gas turbine engine comprising electrical rafts 200A and 2000-200H. FIG. 7 shows seven electrical rafts 200A and 200C-200H, which may be referred to collectively as electrical rafts 200.

Three of the electrical rafts 200A, 200C, 200F have at least one electronic unit 300 mounted thereon. Of these, two electrical rafts, 200A, 200C have an electronic unit 300 mounted thereon such that a surface 310 of the respective electronic unit 300 is a gas-washed surface. The surface 310 of the electronic unit 300 associated with the electrical raft 200A may complete (or form a part of) the nacelle outer surface 32. The surface 310 of the electronic unit 300 associated with the electrical raft 200C may complete (or form a part of) the surface of the core fairing 40 that forms the inner annular surface of the bypass duct 22. As such, the electrical rafts 200A, 200C together with their respective electronic unit each form an electrical assembly 600. These two electrical assemblies 600 shown in FIG. 10 may thus be as described elsewhere herein, for example in relation to FIGS. 3-9. Thus, for example, the electrical raft assemblies 600 shown in FIG. 10 may comprise electrical connectors 700/800, and mounting components, described in greater detail elsewhere.

Although three electrical rafts 200A, 200C, 200F are shown as having an electronic unit 300 mounted thereon, it will be appreciated that any one or more of the electrical rafts 200 may have an electronic unit 300 mounted thereon. Furthermore, any one or more of the electrical rafts 200 may have an electronic unit 300 mounted thereon such that a surface 310 of the respective electronic unit is a gas-washed surface, thereby forming an electrical assembly 600. Each of the electrical rafts 200 shown in FIG. 10 comprises one or more electrical conductors 252 as described elsewhere herein. However, any one or more of the electrical rafts 200 may be replaced with a raft that does not comprise electrical conductors 252. Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine in accordance with the present invention may have a combination of electrical rafts 200 and non-electrical rafts.

The arrangement of electrical rafts 200 and/or electrical assemblies 600 shown in FIG. 10 is by way of example only. Alternative arrangements, for example in terms of number, size, shape and/or positioning, of electrical rafts 200 and/or electrical assemblies 600 may be used. For example, there need not be 7 electrical rafts or 2 electrical assemblies 600, the rafts 200/electrical assemblies 600 may or may not be connected together, and the rafts 200 could be provided to (for example mounted on) any one or more components of the gas turbine engine. Purely by way of example only, connection between electrical rafts 200A, 200D, 200F, 200H mounted on the fan casing 24 to the electrical rafts 200C, 200G mounted on the core casing 28 may be provided at least in part by means other than an additional electrical raft 200E, for example using wire conductors with insulating sleeves. By way of further example, one or more electrical rafts 200 may additionally or alternatively be provided to the nose cone, structural frames or elements within the engine (such as "A-frames"), the nacelle, the fan cowl doors (where fan cowl doors remain), and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts 200 may have a fluid passage 210 embedded therein. The fluid passage 210 may be part of a fluid system, such as a gas (for example pneumatic or cooling gas/air) and/or liquid (for example a fuel, hydraulic and/or lubricant liquid). In the FIG. 10 example, three of the electrical rafts 200A, 200F, 200H comprise a fluid passage 210 at least partially embedded therein. The electrical raft 200F also has a fluid passage (which may be for any fluid, such as those listed above in relation to embedded passage 210) mounted thereon. Such a mounted fluid passage 285 may be provided to any electrical raft, such as any of the electrical rafts 200 shown in FIG. 10. The fluid passages 210, 285 shown in FIG. 10 may be oriented in an axial direction of the engine 10. However, fluid passages may be oriented in any direction, for example axial, radial, circumferential or a combination thereof.

In general, any electrical raft 200 may be provided with and/or may comprise (for example may have mounted on and/or have at least partially embedded therein) at least a part of any component and/or system of a gas turbine engine. Components/systems provided to different rafts 200 may be connected to each other, for example a component mounted on one raft 200 may be connected (for example directly electrically, mechanically and/or fluidly connected) to one or more components mounted on another raft 200.

The electrical rafts 200 may be attached to the rest of the gas turbine engine 10 in any suitable manner. For example, as labelled in relation to electrical raft 200H, mounts 400, which may be anti-vibration mounts, may be used. Using anti-vibration mounts 400 may, for example, allow all components of the electrical raft 200 and/or electrical assembly 600 to be isolated from vibrations. Thus, components of at least two gas turbine engine systems may be vibration isolated using a single set of anti-vibration mounts 400.

The electrical rafts 200A, 200D, 200F, 200H are mounted to a fan case 24 in the example of FIG. 10. Such a mounting may be as described herein, for example in relation to FIG. 4, and/or may comprise anti-vibration mounts. However, electrical rafts 200 such as those described by way of example herein may be provided/mounted anywhere on the engine 10. For example, one or more electrical rafts 200C, 200G may be mounted between an engine core casing 28 and an engine core fairing 40. Also by way of example, one or more electrical raft 200E may be provided as at least a part of (for example in) a passage across the bypass duct 22, such as a bifurcation or splitter. In other respects, the electrical rafts 200 mounted anywhere on the engine may be as described elsewhere herein, or otherwise in accordance with the invention.

Any of the electrical rafts 200 (or non-electrical rafts in an arrangement where at least one the of rafts does not have electrical conductors 252) may have any combination of mechanical, electrical and/or fluid connections to one or more (for example 2, 3, 4, 5 or more than 5) other components/systems of the gas turbine engine 10 and/or the rest of the gas turbine engine 10 itself. Examples of such connections are shown in FIG. 10, and described below, but it will be appreciated that a gas turbine engine 10 including electrical rafts 200 may have connections that are different to those show in FIG. 10. For example, electrical rafts 200 (and/or non-electrical rafts) may be connected together (or to other components) using any combination of electrical, fluid and/or mechanical connectors. Thus, any of the electrical connections 290A/290B, 291-297 shown in FIG. 10 may be any combination of electrical, fluid and/or mechanical connection. Alternatively, electrical rafts 200 (and/or non-electrical rafts) may have no connection to other rafts 200 or components.

A connection 291 is shown between the electrical rafts 200A and 200D. The connection 291 may comprise an electrical connection. Such an electrical connection may be flexible and may, for example, take the form of a flexible printed circuit such as the flexible printed circuit 250 shown in, and described in relation to, FIGS. 7 and 8. Such a flexible electrical connection may be used to electrically connect any electrical raft 200 to any other component, such as another electrical raft 200. A connection 297 (which may be or comprise an electrical connection) is provided between the electrical raft 200A and a part of an airframe, or airframe installation 500, which may, for example, be a pylon. Similarly, a fluid and/or mechanical and/or electrical connection 296 may additionally or alternatively be provided between the airframe 500 and another electrical raft 200F. As shown in FIG. 10, other electrical and/or fluid connections 292, 293, 294, 295 may be provided between electrical rafts 200 and other components, such as other electrical rafts 200.

A direct connection 290A, 290B is provided between the electrical rafts 200F and 200H in the FIG. 10 arrangement. Such a direct connection 290A, 290B may comprise a connector 290A provided on (for example embedded in) one electrical raft 200F connected to a complimentary connector 290B provided on (for example embedded in) another electrical raft 200H. Such a direct connection 290A, 290B may, for example, provide fluid and/or electrical connection between the two electrical rafts 200F, 200H, and may be used to connect any of the rafts 200 shown in FIG. 10 where suitable, including, for example, the electrical rafts 200A, 200E.

Where reference is made herein to a gas turbine engine, it will be appreciated that this term may include a gas turbine engine/gas turbine engine installation and optionally any peripheral components to which the gas turbine engine may be connected to or interact with and/or any connections/ interfaces with surrounding components, which may include, for example, an airframe and/or components thereof. Such connections with an airframe may include, but are not limited to, pylons and mountings and their respective connections. The gas turbine engine itself may be any type of gas turbine engine, including, but not limited to, a turbofan (bypass) gas turbine engine (such as that shown in FIGS. 3, 5 and 10, for example), turbojet, turboprop, ramjet, scramjet or open rotor gas turbine engine, and for any application, for example aircraft, industrial, and marine application. Electrical rafts 200 and/or electrical assemblies 600 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of electrical rafts 200 and/or electrical raft assemblies 600, and gas turbine engines 10 comprising electrical rafts 200 and/or electrical raft assemblies 600, other than those described herein may fall within the scope of the invention. For example, alternative arrangements of electrical rafts 200 and/or electrical assemblies 600 (for example in terms of the arrangement, including number/ shape/positioning/construction, of electrical connectors 700/ 800, the arrangement/shape/positioning/construction of the electrical rafts 200, the type and/or positioning of components (if any) mounted to/embedded in the electrical rafts 200, the rigid material 220 and the electrical conductors 252, and the type/positioning of the electronic unit 300) may fall within the scope of the invention and may be readily apparent to the skilled person from the disclosure provided herein. Alternative arrangements of connections (for example mechanical, electrical and/or fluid) between the electrical (or non-electrical) rafts and between the electrical (or non-electrical) rafts and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. A gas turbine engine comprising:
   a nacelle; and
   an electrical assembly that comprises:
      an electrical raft having a rigid material with at least one electrical conductor embedded therein; and
      an electronic unit mounted on the electrical raft and in electrical connection with the electrical raft,
   wherein:
   the electrical raft is mechanically fixed to a component of the gas turbine engine; and
   at least a part of the electronic unit has an external surface that is flush with an external surface of the nacelle and is exposed to free-stream flow.

2. A gas turbine engine according to claim 1, wherein:
   the electrical raft is provided with a first electrical connector in electrical contact with at least one of said embedded electrical conductors, the first electrical connector being fixed relative to the electrical raft;
   the electronic unit is provided with a second electrical connector, that is complimentary to the first electrical connector, the second electrical connector being fixed relative to the electronic unit; and
   the electrical raft and the electronic unit are in electrical connection through the first and second electrical connectors.

3. A gas turbine engine according to claim 1, wherein the electronic unit is mechanically fixed to another component of the gas turbine engine.

4. A gas turbine engine according to claim 3, wherein the electronic unit and the electrical raft are mechanically fixed to different components of the gas turbine engine.

5. A gas turbine engine according to claim 1, wherein the electronic unit forms at least a part of an external gas-washed surface that, in use, is gas-washed by free-stream flow.

6. A gas turbine engine according to claim 1, wherein:
   the gas turbine engine is a turbofan gas turbine engine having a bypass duct; and
   the electronic unit forms at least a part of a gas-washed surface of the bypass duct.

7. A gas turbine engine according to claim 1, wherein the external surface of the electronic unit forms a substantially continuous gas-washed surface with the external surface the nacelle.

8. A gas turbine engine according to claim 1, wherein the electrical raft is mounted inside the nacelle.

9. A gas turbine engine according to claim 1, wherein the electronic unit is mechanically fixed to the nacelle.

10. A gas turbine engine according to claim 1, wherein the gas turbine engine comprises a fan and a fan case, and the electrical raft is mechanically fixed to the fan case.

11. A gas turbine engine according to claim 1, wherein:
the electrical assembly forms part of a gas turbine engine electrical system; and
the electrical raft comprises a linking electrical connector through which the electrical assembly is electrically connected to a remainder of the gas turbine engine electrical system.

12. A gas turbine engine according to claim 11, further comprising at least one flexible cable electrically connected to the linking electrical connector of the electrical raft and to the remainder of the gas turbine engine electrical system to thereby electrically connect the electrical assembly to the remainder of the gas turbine engine electrical system.

13. A gas turbine engine according to claim 1, wherein the electrical raft comprises a plurality of said electrical conductors provided in a flexible printed circuit as electrically conductive tracks in a flexible substrate.

14. A method of attaching an electronic unit to a gas turbine engine, the gas turbine engine comprising a nacelle and an electrical raft, the method comprising:
slotting the electronic unit into an opening formed in a gas-washed surface of the nacelle; and
electrically connecting the electronic unit to the electrical raft, the electrical raft comprising a rigid material with at least one electrical conductor embedded therein;
wherein
an external surface of the electronic unit, when inserted into the opening, is flush with an external surface of the nacelle that completes the gas-washed surface in which the opening is formed; and
the external surface of the electronic unit is exposed to free-stream flow.

15. A method of attaching an electronic unit to a gas turbine engine according to claim 14, wherein:
the electronic unit and the electrical raft comprise complimentary connectors configured such that electrically connecting the electronic unit to the electrical raft is performed automatically when slotting the electronic unit into the opening.

16. A gas turbine according to claim 1, wherein the electronic unit is mechanically fixed to the component of the gas turbine engine.

* * * * *